United States Patent
Hamada et al.

(10) Patent No.: US 6,570,641 B2
(45) Date of Patent: May 27, 2003

(54) PROJECTION EXPOSURE APPARATUS

(75) Inventors: Tomohide Hamada, Yokohama (JP); Hiroshi Shirasu, Yokohama (JP); Yukio Kakizaki, Yokohama (JP); Kinya Kato, Yokohama (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/955,116

(22) Filed: Sep. 19, 2001

(65) Prior Publication Data

US 2002/0021431 A1 Feb. 21, 2002

Related U.S. Application Data

(60) Division of application No. 09/209,270, filed on Dec. 11, 1998, now Pat. No. 6,317,196, which is a continuation of application No. 08/888,291, filed on Jul. 3, 1997, now abandoned, and a continuation of application No. 08/881,902, filed on Jun. 23, 1997, now Pat. No. 6,049,372.

(30) Foreign Application Priority Data

| Jun. 25, 1996 | (JP) | ............................................. 8-184112 |
| Jun. 25, 1996 | (JP) | ............................................. 8-184113 |
| Jul. 5, 1996 | (JP) | ............................................. 8-195531 |
| Apr. 30, 1997 | (JP) | ............................................. 9-126308 |
| Apr. 30, 1997 | (JP) | ............................................. 9-126309 |

(51) Int. Cl.$^7$ .......................... G03B 21/18; G01B 11/00
(52) U.S. Cl. ........................ 355/53; 356/400; 356/401
(58) Field of Search .............................. 250/492.2, 548; 356/399, 400, 401, 348, 358; 355/53

(56) References Cited

U.S. PATENT DOCUMENTS

| 3,622,244 A | 11/1971 | Chitayet .................... 356/106 |
| 4,589,746 A | 5/1986 | Pavone ....................... 396/548 |
| 4,851,656 A | 7/1989 | Straayer ...................... 250/201 |
| 5,056,921 A | 10/1991 | Chaney ....................... 356/493 |
| 5,523,574 A | 6/1996 | Hamada et al. ........... 250/492.2 |
| 5,552,888 A | 9/1996 | Sogard et al. .............. 356/500 |
| 5,581,075 A | 12/1996 | Naraki et al. ............... 250/205 |
| 5,633,720 A | 5/1997 | Takahashi ................... 356/401 |
| 5,729,331 A | 3/1998 | Tanaka et al. ................. 355/53 |
| 5,757,160 A | 5/1998 | Kreuzer ....................... 318/649 |
| 5,798,822 A | 8/1998 | Miyazaki et al. .............. 355/53 |
| 6,049,372 A | 4/2000 | Kato et al. ..................... 355/53 |
| 6,122,036 A | * 9/2000 | Yamasaki et al. ............. 355/53 |
| 6,317,196 B1 | * 11/2001 | Hamada et al. ................ 355/53 |

FOREIGN PATENT DOCUMENTS

| JP | 7-57986 | 3/1995 |

* cited by examiner

*Primary Examiner*—Rodney Fuller
(74) *Attorney, Agent, or Firm*—Morgan, Lewis & Bockius LLP

(57) ABSTRACT

The projection exposure apparatus can include an illumination optical system for illuminating a portion of a mask pattern on a mask with an exposing radiation flux of a predetermined shape, a fixed support, a projection optical system fixed to the fixed support for projecting the image of the illuminated portion of the mask pattern onto a substrate, and a carriage for integrally holding the mask and the substrate, the carriage being movable in a predetermined direction with respect to the projection optical system successively exposing the substrate with the image of the mask pattern formed by the exposing radiation flux. The projection exposure apparatus further includes a long mirror elongated in the predetermined direction and fixed to the fixed support, the length of the long mirror being at least equal to the stroke of the carriage movement in the predetermined direction, and a measurement system for measuring the position of the mask and the position of the substrate with respect to the long mirror to determine the position of the mask relative to the substrate in a direction perpendicular to the predetermined direction.

23 Claims, 6 Drawing Sheets

PROJECTION EXPOSURE APPARATUS

This is a Divisional application of U.S. application Ser. No. 09/209,270 filed on Dec. 11, 1988 (now U.S. Pat. No. 6,317,196), which is a Continuation of application Ser. No. 08/888,291 filed on Jul. 3, 1997 (now abandoned) and a Continuation of application Ser. No. 08/881,902 filing date Jun. 23, 1997 (now U.S. Pat. No. 6,049,372). This application claims the benefit of the following Japanese applications: JP 8-195531 filed on Jul. 5, 1996, IP 8-184112 filed on Jun. 25, 1996, JP 8-184113 filed on Jun. 25, 1996, JP 9-126308 filed on Apr. 30, 1997, and JP 9-126309 filed Apr. 30, 1997 which are hereby incorporated by reference.

BACKGROUND OF THE INVENTION

1. Field of the Invention

The present invention relates to an exposure apparatus, and more particularly, to a projection exposure apparatus in which a pattern on a mask is projected onto a photosensitive substrate and exposed by moving the mask and the photosensitive substrate in a predetermined direction with respect to a projection optical system.

2. Discussion of the Related Art

FIG. 7 illustrates the construction of a conventional projection exposure apparatus. A pattern on a mask 110 is projected onto a glass plate 114 (photosensitive substrate) at equal magnification via a projection optical system 112. In FIG. 7, the direction of movement (scan) of the mask 110 and glass plate 114 is taken as the X axis, a direction perpendicular to the X-axis in the plane of the mask 110 is taken as the Y-axis, and a direction normal to the mask 110 (i.e., the direction of the optical axis of the projection optical system 112) is taken as the Z-axis. The projection optical system 112 is installed at the center of a C-shaped bridge 116 (fixed support). An illumination optical system 118 includes a light source, such as an ultra-high-pressure mercury lamp, and a fly-eye lens, etc., and is installed on one end of the bridge 116 to illuminate a predetermined portion of the mask 110 with uniform brightness.

The mask 110 and the glass plate 114 are held on a mask stage 120 and a plate stage 122, respectively, such that the mask 110 and the glass plate 114 are substantially parallel to the XY plane. Furthermore, mask stage 120 and plate stage 122 are installed on a carriage 124 as an integral unit. Two Y-direction micromotion actuators 126 and 128 are installed on the carriage 124 beneath the mask stage 120 to adjust the position of the mask stage 120 in the Y direction. An X-direction micromotion actuator 130 is installed on the carriage 124 at the end portion of the mask stage 120 on the side of the projection optical system 112 to adjust the position of the mask stage 120 in the X direction.

The plate stage 122 is constructed in such a way as to be movable in the Z direction and tiltable about the X-axis and the Y-axis in order to substantially match the exposed region on the plate 114 with the pattern imaging plane of the mask 110 formed through the projection optical system 112 during scanning exposure. In other words, the imaging condition is adjusted by moving the plate stage 122 in the Z direction and by adjusting inclination of the glass plate 114 (i.e., tilting the glass plate 114 about the X-axis and the Y-axis). By performing such adjustments, it is possible to make corrections for thickness irregularities, inclination, and deformation, etc., which exist in the glass plate 114.

The carriage 124 can slide in the X direction along guide members 132a and 132b. When the carriage 124 is moved in the X direction with respect to illuminating light emitted by the illumination system 118, the mask 110 and the glass plate 114 are synchronously scanned by the illumination light from the projection optical system 112. This way, the pattern on the mask 110 is successively transferred onto the glass plate 114. Thus, the entire pattern on the mask 110 is projected and exposed onto the glass plate 114 by one scanning operation.

Next, an alignment mechanism for aligning the mask 110 with the glass plate 114 in the abovementioned projection exposure apparatus will be described. Moving mirrors 136a, 136b, 138a, and 138b are fixed to bottom portions of the mask stage 120 and plate stage 122 in respective positions corresponding to the Y-direction micromotion actuators 126 and 128. The moving mirrors 136a and 136b are arranged to reflect laser beams originating from a differential type laser interferometer 140 fixed to the carriage 124. More specifically, a laser beam emitted by the laser interferometer 140 is split into two laser beams by a split optical system 144, and the resultant two laser beams are guided to the moving mirrors 136a and 136b. The laser beams reflected by the moving mirrors 136a and 136b return to the laser interferometer 140 through the split optical system 144. At the interferometer 140, the two light beams reflected by the moving mirrors 136a and 136b are coupled to produce interference. Based on the interference information, the relative positional deviation between the mask 110 and the glass plate 114 in the non-scanning direction (i.e., the Y direction) is detected at a position corresponding to Y-direction micromotion actuator 126.

The moving mirrors 138a and 138b are arranged to reflect laser beams originating from a differential type laser interferometer 142 fixed to the carriage 124. More specifically, a laser beam emitted by the laser interferometer 142 is split into two laser beams by a split optical system 146, and the resultant laser beams are guided to the moving mirrors 138a and 138b. The laser beams reflected by the moving mirrors 138a and 138b return to the laser interferometer 142 through the split optical system 146. At the interferometer 142, the two light beams reflected by the moving mirrors 138a and 138b are coupled to produce interference. Based on the interference information, the relative positional deviation between the mask 110 and the glass plate 114 in the non-scanning direction (i.e., the Y direction) is detected at a position corresponding to Y-direction micromotion actuator 128.

Thus, the relative positional deviation between the mask 110 and the glass plate 114 in the Y direction can be detected by the laser interferometer 140 and the laser interferometer 142 at two points 126, 128, which are separated by a predetermined distance in the X direction. Furthermore, the relative rotational deviation about the Z direction between the mask 110 and the glass plate 114 can be detected from the difference in the results detected at the laser interferometer 140 and laser interferometer 142. When such deviations are detected, the Y-direction micromotion actuators 126, 128 are driven to offset the deviations. Furthermore, since the laser interferometers 140 and 142 utilize laser beams from light sources fixed to the carriage 124, the relative positional deviation detected in the Y direction is unaffected by changes in the attitude of the carriage 124. For example, even when the carriage 124 is displaced in the Y direction due to fluctuations in the X direction movement of the carriage 124, the light sources for the laser interferometers 140 and 142 and the split optical systems 144 and 146 are also displaced together with the carriage 124. Accordingly, no positional deviations between the mask 110 and glass plate 114 are detected in the Y direction.

A reflex mirror 148 and a reflex mirror 150 are disposed on the end portions of the mask stage 120 and plate stage 122, respectively, on the negative X direction side in the positions corresponding to the X-direction micromotion actuator 130. The reflex mirrors 148 and 150 are arranged to reflect laser beams from laser interferometers 152 and 154, respectively. The laser interferometer 152 is a length measuring type interferometer, and emits a laser beam from a light source toward the reflex mirror 148 fixed to the mask stage 120 and toward a fixed mirror (not shown in the figures) fixed to the bridge 116. Furthermore, this interferometer 152 detects interference (synthesis) between the laser beam reflected by the reflex mirror 148 and the laser beam reflected by the fixed mirror, and determines the position of the mask 110 in the X direction on the basis of the interference.

The laser interferometer 154 is also a length measuring type interferometer, and emits a laser beam from a light source fixed to a fixed system, such as the bridge 116 or the projection optical system 112, toward the reflex mirror 150 fixed to the plate stage 122 and toward the abovementioned fixed mirror (not shown in the figures). Furthermore, the interferometer 154 detects interference between the laser beam reflected by the reflex mirror 150 and the laser beam reflected by the fixed mirror, and determine the position of the glass plate 114 in the X direction on the basis of the interference.

Furthermore, the relative positional deviation between the mask 110 and the glass plate 114 in the X direction is detected from the difference in the results detected at the laser interferometer 152 and laser interferometer 154. More specifically, the relative difference between the position of the mask 110 in the X direction measured by the laser interferometer 152 and the position of the glass plate 114 in the X direction measured by the laser interferometer 154 is determined. Here, since light sources used for laser interferometers 152 and 154 are fixed to the fixed system (bridge 116 or the projection optical system 112, etc.), changes in the attitude of the carriage 124 in the pitching direction (direction of rotation about the Y-axis), i.e., the relative positional deviation between the mask 110 and the glass plate 114 in the scanning direction (the X direction) including the pitching amount of the carriage 124, can be detected. The output of the laser interferometer 154 at the plate stage 122 side is fed back to a carriage driving controller (not shown in the figures) to control the speed of the carriage 124 relative to the projection optical system 112 so as to produce uniform exposure across the entire area of the glass plate 114 during scanning exposure.

A long reflex mirror 156 extending in the X direction is fixed to the upper surface of the carriage 124 to reflect the laser beam emitted by a laser interferometer 158. The laser interferometer 158 is a differential type interferometer which detects changes in the attitude of the carriage 124 in the rolling direction (the direction of rotation about the X-axis). In this interferometer system, a laser beam emitted by a light source fixed to the bridge 116 is split into two beams and is guided to two points on the reflex mirror 156, which are separated along the Z direction. The laser beams reflected by the reflex mirror 156 are coupled to yield interference at the interferometer 158. According to the interference, the amount of rotation of the carriage 124 about the X-axis, i.e., the rolling amount, is detected. The positional deviations of the mask 110 and the glass plate 114 relative to the fixed system in the Y direction is determined on the basis of the rolling amount detected by the interferometer 158. This deviation is corrected by driving the Y-direction micromotion actuators 126 and 128.

In the conventional projection exposure apparatus described above, the laser interferometers 140 and 142 and the split optical systems 144 and 146 for the interferometers are fixed to the carriage 124. Accordingly, if the carriage 124 is deformed due to poor straightness of the guide members 132a and 132b, etc., a relative displacement is generated between the split optical system 144 and split optical system 146. As a result, the measured values by the laser interferometers 140 and 142, i.e., the relative positional deviation between the mask 110 and the glass plate 114 in the Y direction, may contain errors.

Furthermore, since the laser interferometers 140 and 142 are installed on the carriage 124, it is necessary to apply a large driving force to drive the carriage 124. Moreover, since the long reflex mirror 156 is fixed to the carriage 124 and the weight of the carriage 124 includes the weight of the reflex mirror 156, the driving force to the carriage 124 needs to be increased even further. As a result, the size of the driving system becomes undesirably large. With such a large driving system, it is difficult to achieve high scanning precision (uniform speed control, etc.) for the carriage 124.

SUMMARY OF THE INVENTION

Accordingly, the present invention is directed to a projection exposure apparatus that substantially obviates the problems due to limitations and disadvantages of the related art.

An object of the present invention is to provide a projection exposure apparatus in which the relative positional deviation between the mask and the photosensitive substrate in the non-scanning direction can be accurately detected.

Another object of the present invention is to provide a projection exposure apparatus which is compact and light in weight and has a stable operating precision.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention provides a projection exposure apparatus, including an illumination optical system for illuminating a portion of a mask pattern on a mask with an exposing radiation flux of a predetermined shape; a fixed support; a projection optical system fixed to the fixed support for projecting the image of the illuminated portion of the mask pattern onto a substrate; a carriage for integrally holding the mask and the substrate, the carriage being movable in a predetermined direction with respect to the projection optical system to successively expose the substrate with the image of the mask pattern formed by the exposing radiation flux; a long mirror elongated in the predetermined direction and fixed to the fixed support, the length of the long mirror being at least equal to the stroke of the carriage movement in the predetermined direction; and a measurement system for measuring the position of the mask and the position of the substrate with respect to the long mirror to determine the position of the mask relative to the substrate in a direction perpendicular to the predetermined direction.

In another aspect, the present invention provides a position detector for detecting the position of a movable stage moving relative to a fixed support in a predetermined direction with a predetermined moving range, the position detector including an extended mirror fixed to the fixed support of the exposure apparatus, the extended mirror being elongated in the predetermined direction and longer than the predetermined moving range of the movable stage; an optical element installed on the movable stage; and an optical measurement system for optically measuring the positional relationship between the extended mirror and the optical element to derive the position of the movable stage relative to the fixed support in a direction perpendicular to the predetermined direction.

In a further aspect, the present invention provides an exposure apparatus for projecting a mask pattern on a mask onto a substrate at equal magnification, including a fixed support; an illumination optical system fixed to the fixed support for emitting an exposing radiation flux to illuminate a portion of the mask pattern on the mask; a projection optical system fixed to the fixed support for projecting the image of the illuminated portion of the mask pattern onto the substrate at equal magnification; a carriage for integrally holding the mask and the substrate in parallel, the carriage being movable in a predetermined moving direction substantially parallel to the surfaces of the mask and the substrate with a predetermined moving range to successively exposing the substrate with the image of the mask pattern formed by the exposing radiation flux; a first optical element adjacent the mask; a second optical element adjacent the substrate; a first extended mirror optically coupled to the first optical element, the first extended mirror being fixed to the fixed support and extending in the predetermined moving direction of the carriage, the first extended mirror being longer than the predetermined moving range of the carriage; a second extended mirror optically coupled to the second optical element, the second extended mirror being fixed to the fixed support and extending in the predetermined moving direction of the carriage, the second extended mirror being longer than the predetermined moving range of the carriage; and an optical measurement system for optically measuring the position of the first optical element relative to the first extended mirror and the position of the second optical element relative to the second extended mirror to determine the position of the mask relative to the substrate in a direction perpendicular to the predetermined moving direction of the carriage.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
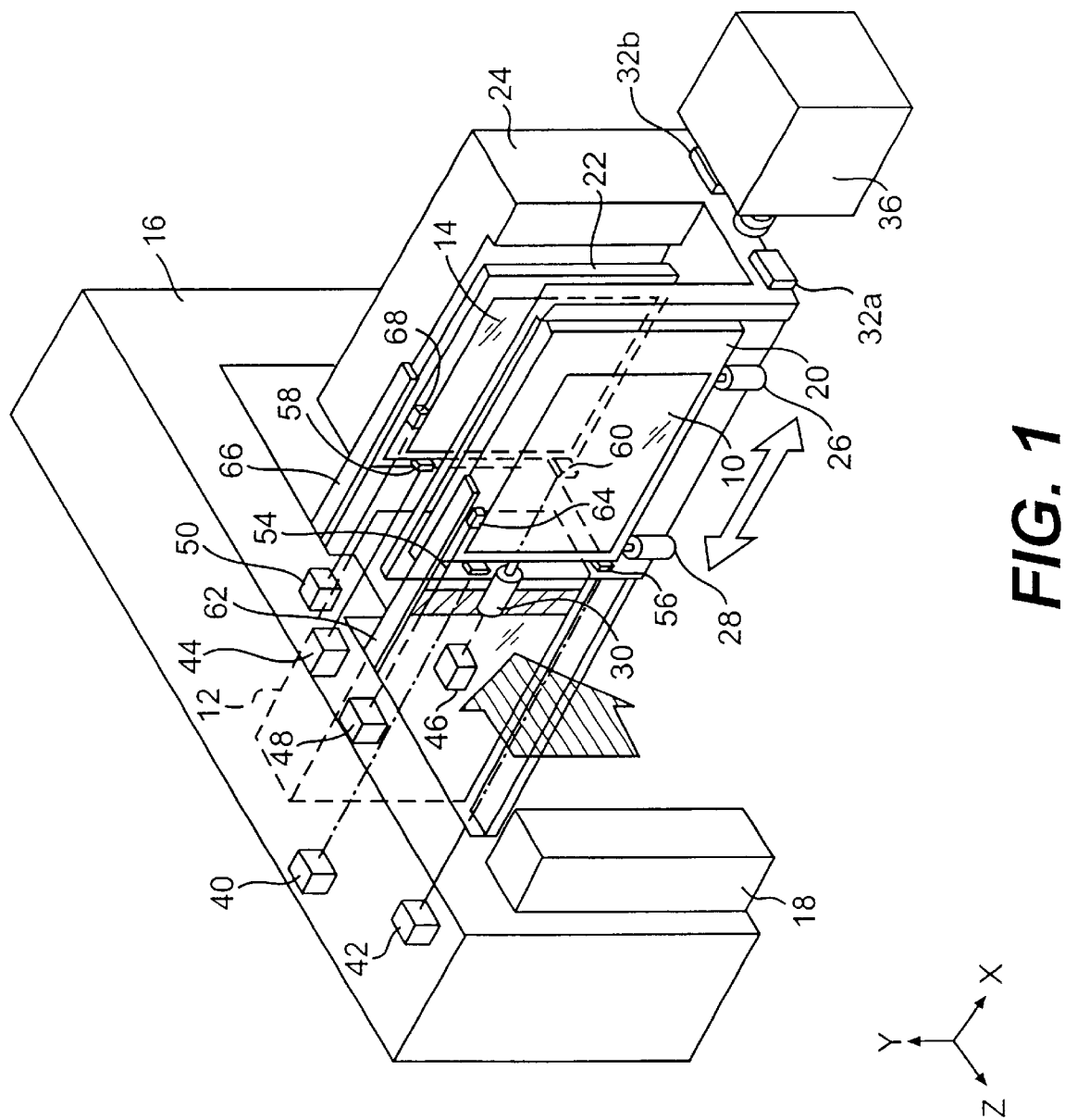
FIG. 1 is a perspective view illustrating an equal-magnification upright image type projection exposure apparatus according to an embodiment of the present invention.

FIG. 1 shows the construction of the projection exposure apparatus according to a preferred embodiment of the present invention. In this embodiment, the present invention is applied to a scan type projection exposure apparatus. A pattern on a mask 10 is projected onto a glass plate 14 (photosensitive substrate) via a projection optical system 12 at equal magnification. In FIG. 1, the direction of movement (scanning) of the mask 10 and glass plate 14 is taken as the X axis, a direction perpendicular to the X-axis in the plane of the mask 10 is taken as the Y-axis, and a direction normal to the mask 10 (i.e., the direction of the optical axis of the projection optical system 12) is taken as the Z-axis. The projection optical system 12 is fixed at the center of a C-shaped bridge 16 (fixed support). An illumination optical system 18 including a light source, such as an ultra-high-pressure mercury lamp, and a fly-eye lens, etc., is fixed to one end of the bridge 16, to illuminate a predetermined portion of a mask 10 with uniform brightness.

The mask 10 and the glass plate 14 are held on a mask stage 20 and a plate stage 22, respectively, such that the mask 10 and glass plate 14 are substantially parallel to the XY plane. Furthermore, the mask stage 20 and plate stage 22 are integrally held by a common carriage 24. Two Y-direction micromotion actuators 26 and 28 are fixed to the carriage 24 beneath the mask stage 20 to adjust the position of the mask stage 20 in the Y direction. An X-direction micromotion actuator 30 is installed on the carriage 24 at the end portion of the mask stage 20 at the projection optical system 12 side to adjust the position of the mask stage 20 in the X direction.

The plate stage 22 is constructed to be movable in the Z direction and tiltable about the X-axis and the Y-axis in order to substantially match the exposure region on the plate 14 with the pattern imaging plane of the mask 10 formed through the projection optical system 12 during scanning exposure. In other words, the imaging conditions are adjusted by moving the plate stage 22 in the Z direction and by adjusting inclination of the glass plate 14 (i.e., tilting about the X-axis and the Y-axis). By performing such adjustments, it is possible to make corrections for thickness irregularities, inclination and deformation, etc., which may exist in the glass plate 14.

The carriage 24 is constructed to be slidable in the X direction along guide members 32a and 32b by a driving system 36. When the carriage 24 is moved in the X direction with respect to the illuminating light emitted by the illumination system 18, the mask 10 and the glass plate 14 are synchronously scanned with respect to the projection optical system 12 (i.e., the illuminating light). This way, the pattern on the surface of the mask 10 is successively transferred onto the glass plate 14. Thus, the entire pattern region on the mask 10 is projected and exposed onto the glass plate 14 (i.e., transferred onto the glass plate 14) by one scanning operation.

Figure 2:
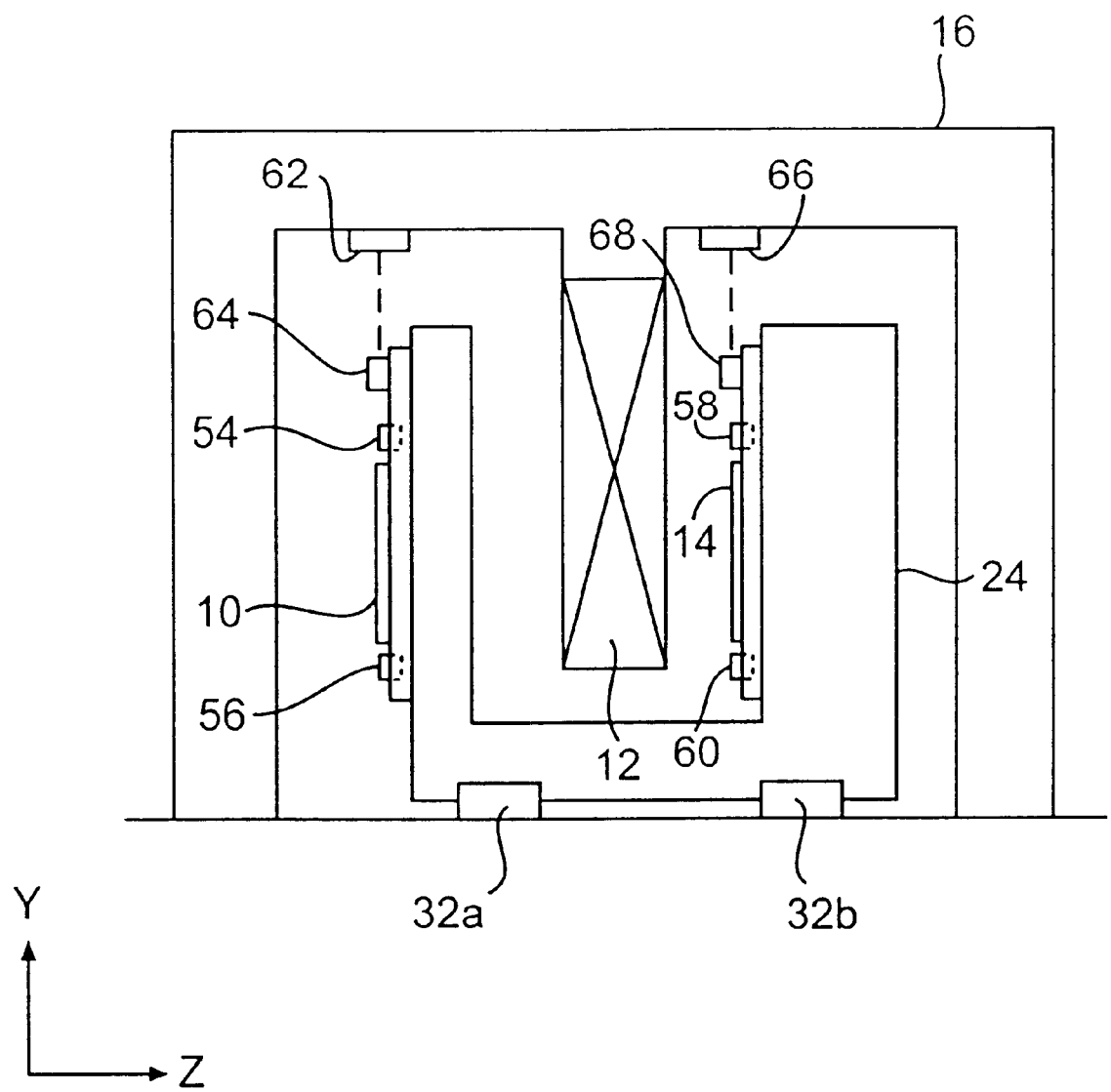
FIG. 2 is a schematic side view of the projection exposure apparatus of FIG. 1.
Figure 3:
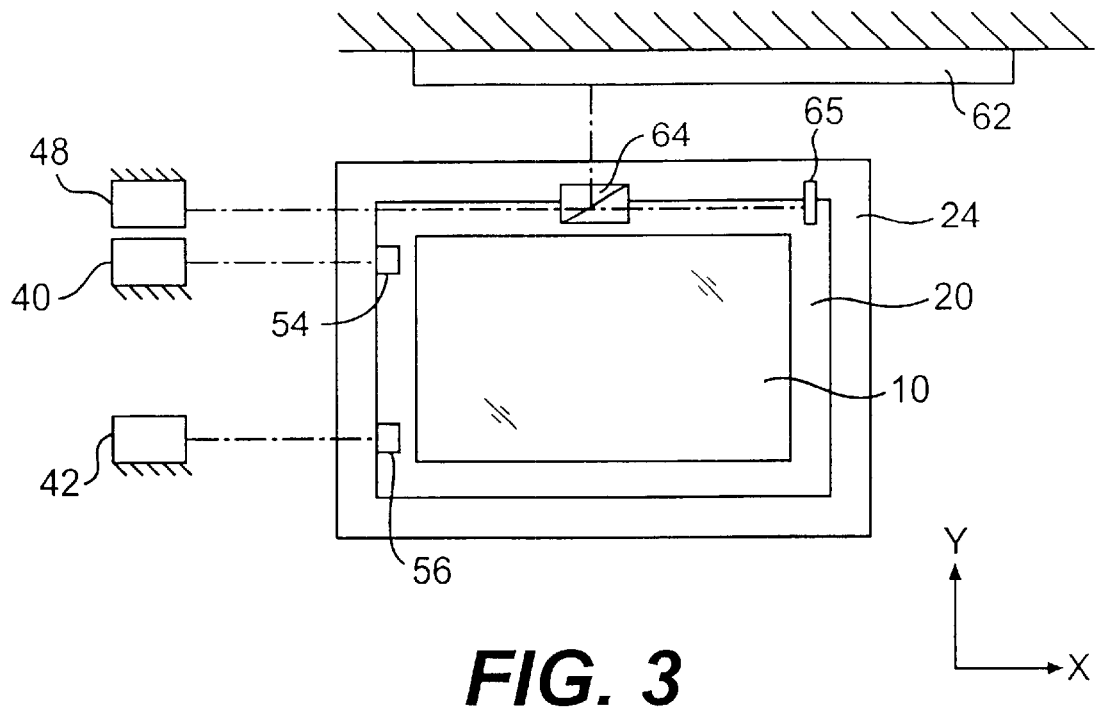
FIG. 3 is a front view showing the schematic construction (layout) of an interferometer system for the projection exposure apparatus of FIG. 1.

Next, the alignment mechanism for aligning the mask 10 with the glass plate 14 in the abovementioned projection exposure apparatus will be described with reference to FIGS. 1, 2, and 3. In this embodiment, the positions of the mask 10 and glass plate 14 are measured using six laser interferometers 40, 42, 44, 46, 48, 50, which are fixed to the bridge 16. The laser interferometers 40 and 42 emit measurement-use laser beams toward reflex mirrors 54 and 56, respectively, disposed on the side edge of the mask stage 20 facing the projection optical system 12. The reflex mirrors 54 and 56 are disposed with a predetermined spacing in the Y direction, and the reflecting surfaces of the mirrors are parallel to the YZ plane. The laser interferometers 40 and 42 measure the position of the mask 10 in the X direction on the basis of the laser beams reflected by the reflex mirrors 54 and 56. Furthermore, the rotational displacement of the mask 10 about the Z-axis can be determined from the measured values obtained by the laser interferometers 40 and 42. More specifically, the rotational displacement of the mask 10 about the Z-axis can be determined from the relative displacement between the position of the reflex mirror 54 (i.e., the position of the mask 10) measured by the laser interferometer 40 and the position of the reflex mirror 56 (i.e., the position of the mask 10) measured by the laser interferometer 42.

The laser interferometers 44 and 46 emit measurement-use laser beams toward reflex mirrors 58 and 60, respectively, disposed on the side edge of the plate stage 22 facing the projection optical system 12. The reflex mirrors 58 and 60 are disposed with a predetermined spacing in the Y direction, and the reflecting surfaces of the mirrors are parallel to the YZ plane. The laser interferometers 44 and 46 measure the position of the glass plate 14 in the X direction on the basis of the laser beams reflected by the reflex mirrors 58 and 60. Furthermore, the rotational displacement of the glass plate 14 about the Z-axis can be determined from the measured values obtained by the laser interferometers 44 and 46. More specifically, the rotational displacement of the glass plate 14 about the Z-axis can be determined from the relative displacement between the position of the reflex mirror 58 (i.e., the position of the glass plate 14) measured by the laser interferometer 44 and the position of the reflex mirror 60 (i.e., the position of the glass plate 14) measured by the laser interferometer 46.

The laser interferometer 48 measures the position of the mask 10 in the Y direction. This interferometer 48 illuminates a long reflex mirror 62 (one end of which is fixed to the ceiling portion of the bridge 16) with a measurement-use laser beam through a split optical system 64 fixed to the mask stage 20. The reflex mirror 62 has a length which is equal to or larger than the movement stroke of the carriage 24. One end of this mirror 62 is fixed to the bridge 16, whereas the other end extends in the direction of the mask stage 20 (X direction). Furthermore, the reflecting surface (bottom surface) of the reflex mirror 62 is oriented perpendicular to the Y axis (i.e., parallel to the XZ plane). The split optical system 64 guides the laser beam emitted by the laser interferometer 48 in a direction perpendicular to the reflecting surface of the reflex mirror 62. The laser interferometer 48 receives the laser beam reflected from the reflecting mirror 62 to measure the position of the mask 10 in the Y direction with respect to the reflex mirror 62. More specifically, the displacement of the mask 10 in the Y direction is measured using a fixed system (bridge 16, projection optical system 12, etc.) as a reference.

The laser interferometer 50 measures the position of the glass plate 14 in the Y direction. This interferometer 50 illuminates a long reflex mirror 66 (one end of which is fixed to the ceiling portion of the bridge 16) with a measurement-use laser beam through a split optical system 68 fixed to the plate stage 22. Like the abovementioned reflex mirror 62, the reflex mirror 66 has a length which is equal to or larger than the movement stroke of the carriage 24. One end of the mirror 66 is fixed to the bridge 16, whereas the other end is extending in the direction of the plate stage 22 (X direction). Furthermore, the reflecting surface (bottom surface) of the reflex mirror 66 is oriented perpendicular to the Y axis (i.e., parallel to the XZ plane). The split optical system 68 guides the laser beam emitted by the laser interferometer 50 in a direction perpendicular to the reflecting surface of the reflex mirror 66. The laser interferometer 50 receives the laser beam reflected from the reflecting mirror 66 to measure the position of the glass plate 14 in the Y direction with respect to the reflex mirror 66. More specifically, the displacement of the glass plate 14 in the Y direction is measured using the fixed system (bridge 16, projection optical system 12, etc.) as a reference.

For example, polarizing beam splitters may be used as the split optical systems 64, 68 for guiding the laser beams from the laser interferometers 48 and 50 to the reflex mirrors 62 and 66, respectively. FIG. 3 illustrates the construction of such an interferometer system, which measures the displacement of the mask 10 (glass plate 14) in the Y direction. Here, a reference mirror 65 is disposed on the rear side of a polarizing beam splitter 64 installed on the mask stage 20. This reference mirror 65 reflects the laser beam that passes through the polarizing beam splitter 64. In the present embodiment, a portion of the light emitted by the laser interferometer 48 is directed to the reflex mirror 62 by the polarizing beam splitter 64, while the remaining light passes through the polarizing beam splitter 64 and impinges on the reference mirror 65.

The laser interferometer 48 measures the position of the mask 10 in the Y direction with respect to the reflex mirror 62 from the difference in optical path length between the laser beam reflected by the reflex mirror 62 and the laser beam reflected by the reference mirror 65. That is, when the mask 10 is displaced in the Y direction with respect to the reflex mirror 62, the length of the optical path from the polarizing beam splitter 64 to the reflex mirror 62 changes. Therefore, a relative difference in optical path length is generated between the laser beam returning from the reflex mirror 62 and the laser beam returning from the reference mirror 65. Accordingly, the position of the of the mask 10 in the Y direction can be measured on the basis of interference between the two laser beams received by the laser interferometer 48. The split optical system 68 for the plate stage 22 may have a similar construction.

In the present embodiment, relative translational displacements ΔX, ΔY in the X and Y directions and relative rotational displacement ΔXθ, ΔYθ, ΔZθ about the X, Y, and Z axes between the mask 10 and the glass plate 14 can be detected on the basis of the measured values obtained by the six laser interferometers 40, 42, 44, 46, 48, 50 above. In detail, the position MX of the mask 10 in the X direction is determined on the basis of the measured value MX1 obtained by the laser interferometer 40 and the measured value MX2 obtained by the laser interferometer 42 by taking an average, for example. Furthermore, the rotational displacement MZθ of the mask 10 about the Z axis is determined from the difference between the measured value MX1 obtained by the laser interferometer 40 and the measured value MX2 obtained by the laser interferometer 42. In addition, the position MY of the mask 10 in the Y direction is determined from the measured value obtained by the laser interferometer 48.

As for the glass plate 14, the position PX of the glass plate 14 in the X direction is determined on the basis of the measured value PX1 obtained by the laser interferometer 44 and the measured value PX2 obtained by the laser interferometer 46 by taking an average, for example. The rotational displacement PZθ of the glass plate 14 about the Z axis is determined from the difference between the measured value PX1 obtained by the laser interferometer 44 and the measured value PX2 obtained by the laser interferometer 46. In addition, the position PY of the glass plate 14 in the Y direction is determined from the measured value obtained by the laser interferometer 50.

Furthermore, the relative deviation ΔX between the mask 10 and the glass plate 14 in the X axis including pitching (rotation about the Y-axis) of the carriage 24 is determined from the difference between the position MX of the mask 10 in the X direction and the position PX of the glass plate 14 in the X direction determined above. Moreover, the relative deviation ΔY between the mask 10 and the glass plate 14 in the Y direction including rolling (rotation about the X-axis) of the carriage 24 is determined from the difference between the position MY of the mask 10 in the Y direction and the position PY of the glass plate 14 in the Y direction. In addition, the relative rotational deviation ΔZθ between the mask 10 and the glass plate 14 about the Z-axis is determined from the rotational displacement MZθ of the mask 10 about the Z axis and the rotational displacement PZθ of the glass plate 14 about the Z direction.

Next, the overall operation of the present embodiment will be described. First, an alignment mark on the mask 10 and an alignment mark on the glass plate 14 are simultaneously observed using a microscope (not shown in the figures) to perform initial alignment of the mask 10 with glass plate 14. Then, the laser interferometers 40, 42, 44, 46, 48, 50 are calibrated; the measured values output from the respective laser interferometers 40, 42, 44, 46, 48, 50 are set to zero. Next, scanning exposure is initiated by driving the carriage 24 in the X direction via the driving system 36. During the scanning exposure, the relative positional deviations ΔX, ΔY, ΔZθ between the mask 10 and the glass plate 14 are determined through the laser interferometers 40, 42, 44, 46, 48, 50 using the procedures described above. The driving amounts (adjustment amounts) of the micromotion actuators 26, 28, and 30 installed on the mask stage 20 are determined in accordance with the positional deviations ΔX, ΔY and ΔZθ thus determined. Accordingly, positional adjustments of the mask 10 and glass plate 14 in the X direction, Y direction, and the rotational direction about the Z-axis are accomplished by feedback control of the micromotion actuators 26, 28 and 30.

In the embodiment above, since the reflex mirrors 62 and 66 are fixed to the bridge 16, relative positional deviations between the mask 10 and glass plate 14 including relative positional deviations caused by changes in the attitude or local deformation of the carriage 24 can be detected. Accordingly, even if the carriage 24 itself is deformed due to insufficient straightness of the guide members 32a, 32b of the carriage 24, etc., the positions of the mask 10 and glass plate 14 can be accurately detected and corrected using the projection optical system 12 as a reference. As a result, the desirable positional relationship of the mask 10 and the glass plate 14 with respect to the projection optical system 12 can be maintained regardless of the guidance precision (movement performance) of the mechanical system for the carriage 24 or deformation of the carriage 24 itself Therefore, high exposure precision (transfer precision) can be maintained.

Furthermore, since the reflex mirrors 62, 66 are not installed on the carriage 24, the weight of the carriage 24 can be reduced as compared with the conventional exposure apparatus above. As a result, the size of the driving system 36 can be reduced and the constant-speed characteristics during scanning exposure can be improved, leading to stable exposure operation.

FIGS. 4, 5A, 5B, and 6 illustrate various modifications of the interferometer system for measuring the relative positional deviation ΔY between the mask 10 and the glass plate 14 in the Y direction. The constituent elements similar to those mentioned above are labeled with the same reference numerals and the descriptions thereof are not repeated below.

Figure 4:
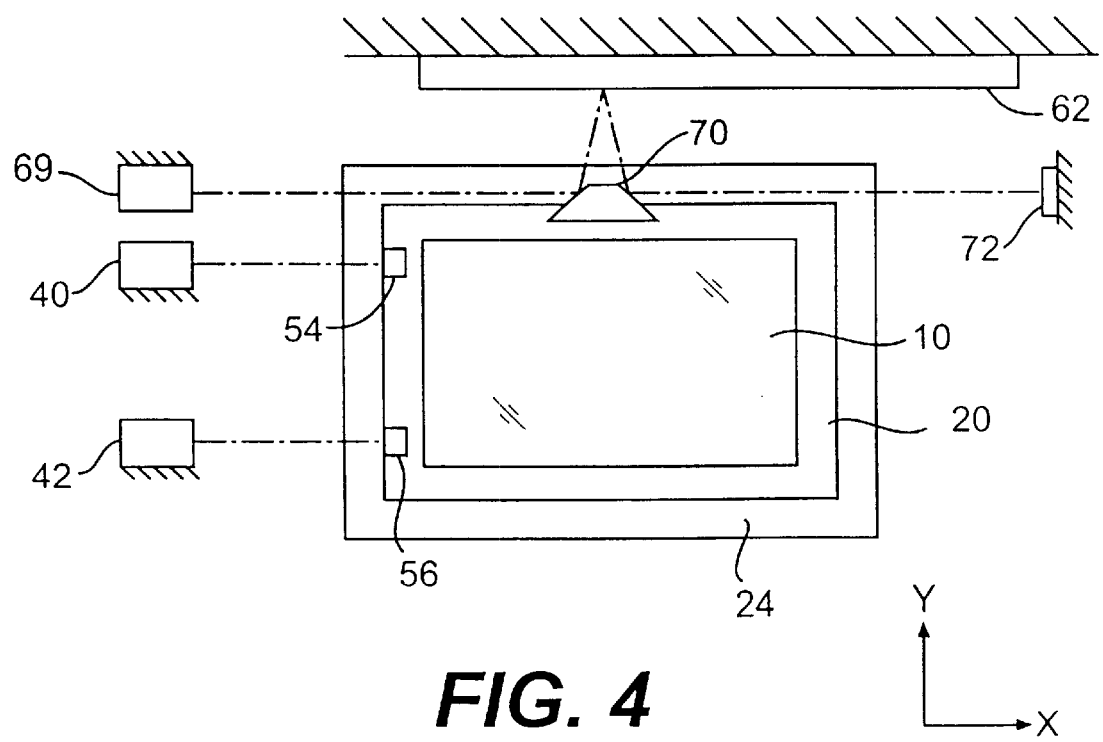
FIG. 4 is a front view showing the schematic construction (layout) of a modified interferometer system for the projection exposure apparatus of FIG. 1.

The interferometer system illustrated in FIG. 4 is equipped with a laser interferometer 69, a trapezoidal mirror 70 disposed on the mask stage 20, and a reference mirror 72 disposed on a fixed system including the bridge 16, etc. Although not shown in the figure, a trapezoidal mirror and a reference mirror are similarly provided for the glass plate 14. The laser interferometer 69 is arranged such that a single laser beam is split into two laser beams and is guided toward the side edge of the mask 10 and the side edge of the glass plate 14, respectively. On the side of the mask 10, one of the light beams emitted by the laser interferometer 69 is reflected by the trapezoidal mirror 70 toward the reflex mirror 62. The light reflected by the reflex mirror 62 is reflected by the other side of the trapezoidal mirror 70 and impinges on the reference mirror 72. Such configuration is also employed for the glass plate 14. In the laser interferometer 69, the respective light beams returning from the mask 10 and the glass plate 14 are coupled (synthesized), and interference between the two light beams are observed. This way, the relative positional deviation ΔY between the mask 10 and the glass plate 14 in the Y direction is measured.

Figure 5A:
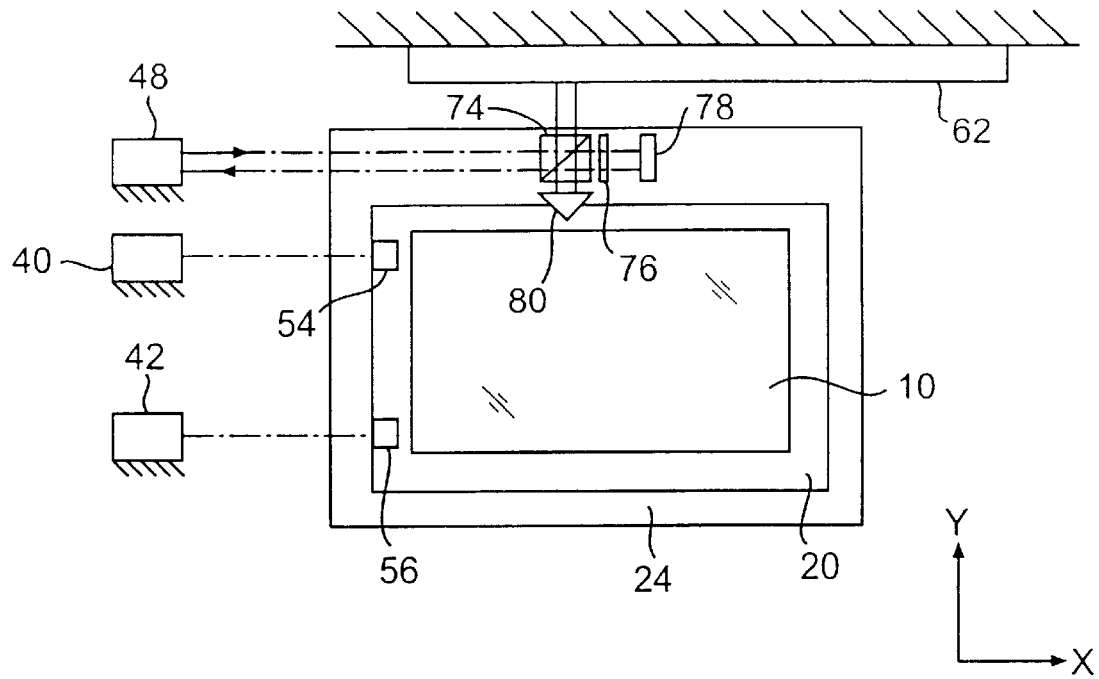
FIG. 5A is a front view showing the schematic construction (layout) of another modified interferometer system for the projection exposure apparatus of FIG. 1.

FIG. 5A shows the construction of another modification of the interferometer system for measuring the positional deviations of the mask 10 and the glass plate 14 in the Y direction according to the present invention. Although FIG. 5A shows the interferometer system only for the mask 10, a similar arrangement may be constructed for the glass plate 14. This interferometer system is equipped with a laser interferometer 48, a polarizing beam splitter 74 for splitting a laser beam from the laser interferometer 48 into two laser beams, a λ/4 plate 76 for altering the phase of the laser beam, a reference mirror 78 disposed on the mask stage 20, and a corner cube 80 disposed beneath the polarizing beam splitter 74. This example uses a so-called "double-beam interferometer" which utilizes two light beams. The system is arranged such that the distance from the reflecting surface of the polarizing beam splitter 74 to the reflecting surface of the reference mirror 78 is equal to the distance from the reflecting surface of the polarizing beam splitter 74 to the reflex mirror 62.

In the present example, when the mask stage 20 is displaced with respect to the reflex mirror 62 in the Y direction, the length of the optical path of the reflected laser beam returning from the reflex mirror 62 changes.

Accordingly, a difference in optical path length is generated between the laser beam returning from the reflex mirror 62 and the reflected laser beam returning from the reference mirror 78 (the latter has a fixed optical path length). The position of the mask 10 in the Y direction is detected by the laser interferometer 48 from interference between the two returning laser beams. Here, the measurements above can also be performed using a single light beam.

Figure 5B:
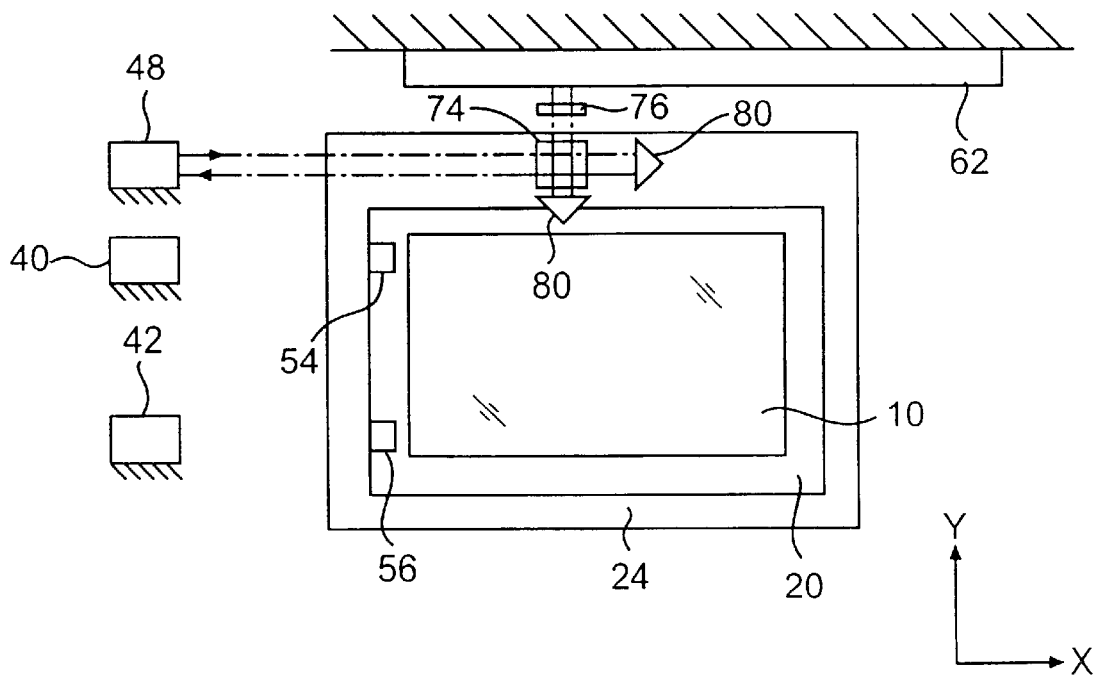
FIG. 5B is a front view showing the schematic construction (layout) of another modified interferometer system for the projection exposure apparatus of FIG. 1.

FIG. 5B shows a modification of the interferometer system of FIG. 5A. In this modification, a corner cube 80 is used instead of the reference mirror 78 and a λ/4 plate 76 is disposed between the polarizing beam splitter 74 and the reflex mirror 62.

Figure 6:
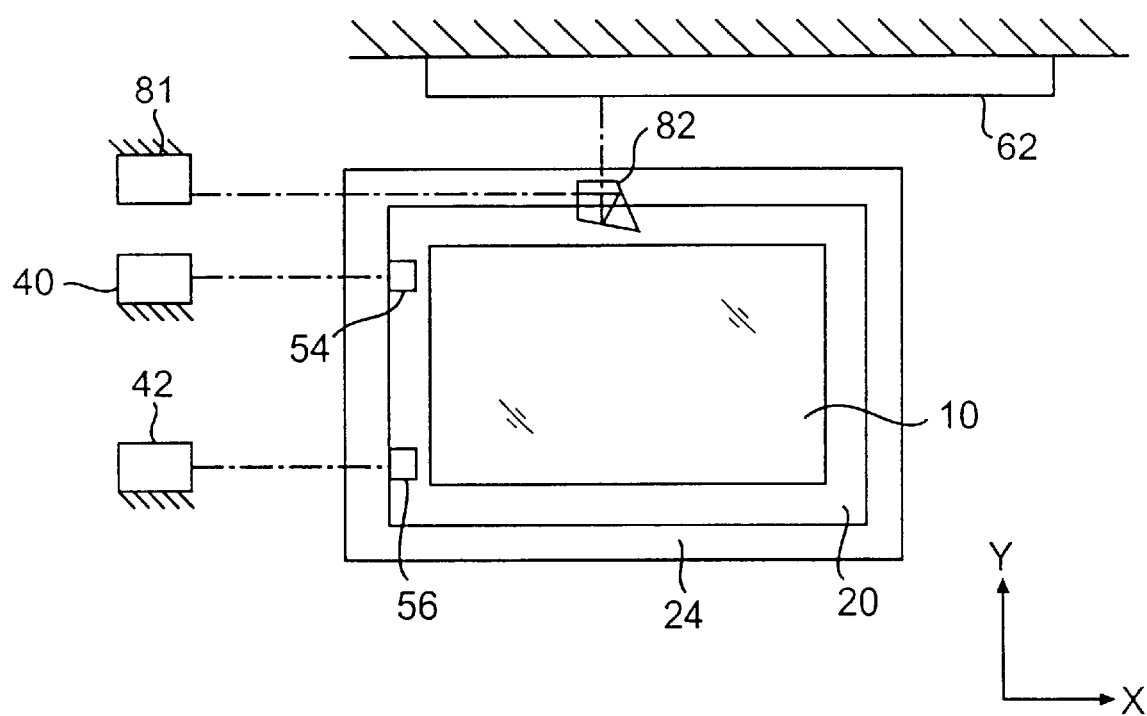
FIG. 6 is a front view showing the schematic construction (layout) of a further modified interferometer system for the projection exposure apparatus of FIG. 1.
Figure 7:
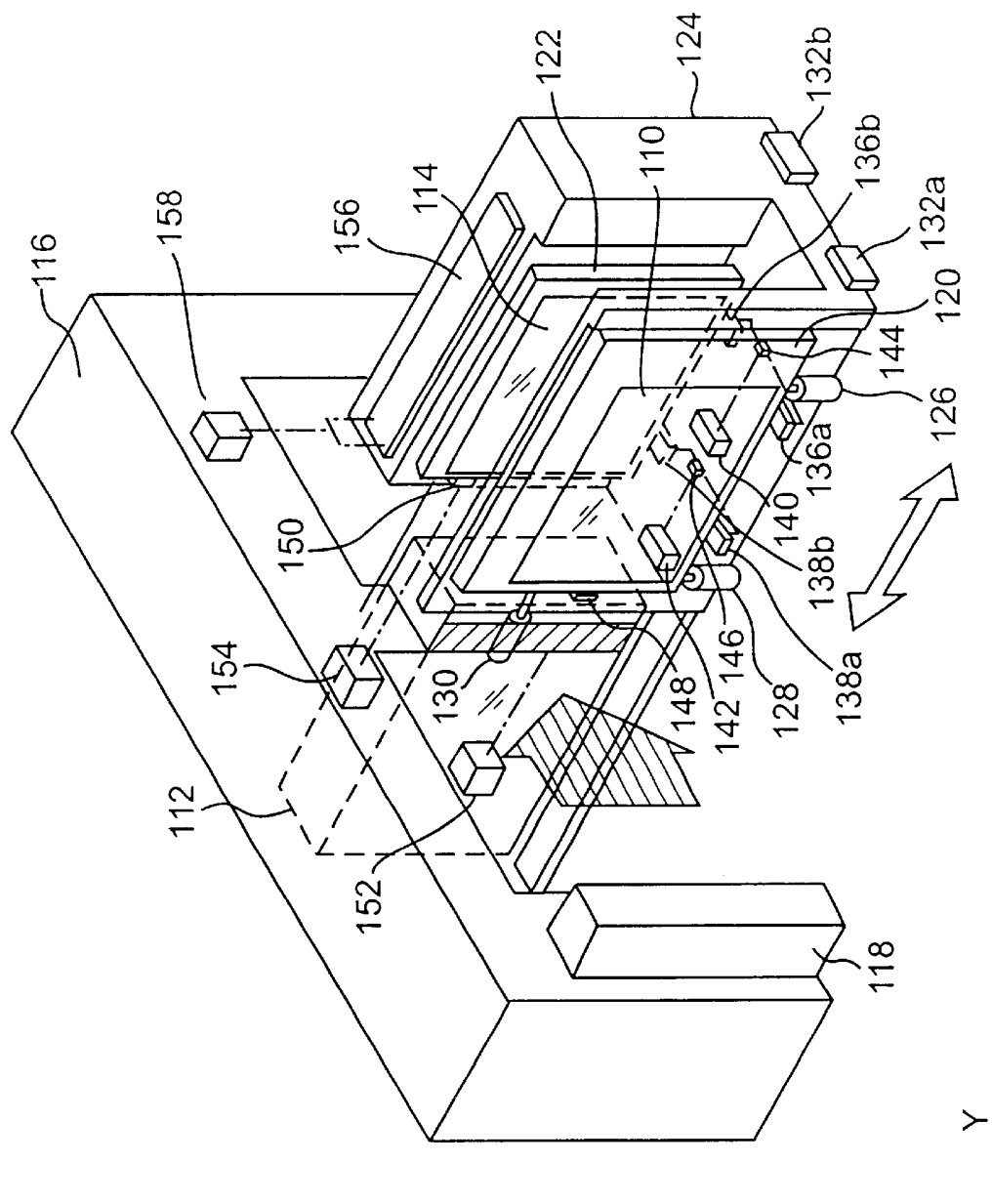
FIG. 7 is a perspective view showing the construction of a conventional projection exposure device.

FIG. 6 shows a further modification of the interferometer system for measuring the relative positional deviation between the mask 10 and the glass plate 14 in the Y direction according to the present invention. This interferometer system is equipped with a laser interferometer 81 and a pentaprism 82 disposed on the mask stage 20. Furthermore, although not shown in the figures, a similar pentaprism is also provided for the glass plate 14. The laser interferometer 81 is arranged such that a single laser beam is split into two beams and is guided toward the respective pentaprisms for the mask 10 and the glass plate 14. At the mask 10 side, one of the laser beams is reflected by the pentaprism 82 and is directed toward the reflex mirror 62. The light reflected by the reflex mirror 62 then returns to the laser interferometer 81 after reflected by the pentaprism 82 for the second time. At the laser interferometer 81, the respective light beams returning from the mask 10 and the glass plate 14 are coupled (synthesized), and interference between the two laser beams is observed. This way, the relative positional deviation ΔY between the mask 10 and the glass plate 14 in the Y direction is measured.

In the embodiment above, the reflex mirrors 62 and 66 were fixed to the bridge 16. However, it is also be possible to dispose these mirrors in some other locations on the fixed system (bridge 16, projection optical system 12, etc.). For example, these mirrors may be fixed to the projection optical system 12.

In the present invention, as described above, measurement-use light (or laser beam) is projected onto long mirrors fixed to a fixed system (bridge, projection optical system, etc.) and the relative positional deviation ΔY between the mask and the photosensitive substrate (glass substrate) in a direction (Y direction) perpendicular to the scanning direction (X direction) is measured on the basis of the measurement-use lights reflected from the long mirrors. Accordingly, the desirable positional relationship of the mask and the photosensitive substrate with respect to the projection optical system can be maintained regardless of the guidance precision (movement performance) of the mechanical system for the carriage or deformation of the carriage itself. Therefore, high exposure precision (transfer precision) is maintained. Furthermore, the size of the driving system, which drives the carriage, can be reduced, and the constant-speed characteristics during scanning exposure can be improved, yielding stable exposure operation.

In the present invention, as described above, the long mirrors are fixed not to the carriage of the mask and photosensitive substrate, but to a fixed system (bridge 16, projection optical system, etc.). Accordingly, the weight of the carriage can be reduced. Therefore, the size and/or load of the driving system including actuators, etc., for adjusting the relative position of the mask and photosensitive substrate, can be reduced. As a result, the constant-speed characteristics during scanning exposure can be improved, resulting in stable exposure performance.

Furthermore, according to the present invention, the rotational deviation about the direction of movement of the carriage (i.e., rotation about the X direction) can also be measured. In other words, relative positional deviations between the mask and the photosensitive substrate including relative positional deviations caused by changes in the attitude and/or local deformation of the carriage can be detected. Accordingly, even if the carriage is deformed as a result of poor straightness of the guide surfaces of the carriage, etc., the positions of the mask and photosensitive substrate can be accurately detected and corrected using the projection optical system (or the fixed system) as a reference. As a result, the positional relationship of the mask and the photosensitive substrate with respect to the projection optical system can be accurately maintained regardless of the guidance precision (movement performance) of the mechanical system for the carriage or deformation of the carriage itself. Therefore, high exposure precision (transfer precision) can be maintained.

It will be apparent to those skilled in the art that various modifications and variations can be made in the projection exposure apparatus of the present invention without departing from the spirit or scope of the invention. Thus, it is intended that the present invention cover the modifications and variations of this invention provided they come within the scope of the appended claims and their equivalents.

What is claimed is:

1. An exposure apparatus that exposes a pattern of a mask onto a substrate, comprising:
   a stage that moves in a first direction;
   a first optical element of the stage, the first optical element having an acute angle surface to the first direction;
   a second optical element of the stage, the second optical element having a surface that is substantially perpendicular to the first direction;
   a projection optical system located between the mask and the substrate to project the pattern onto the substrate;
   a support that holds the projection optical system;
   a third optical element is held by the support, the third optical element having a reflection surface along the first direction and being optically coupled to the first optical element;
   a first detector optically coupled to the first and third optical elements so as to detect a position of the stage in a direction substantially perpendicular to the first direction; and
   a second detector optically coupled to the second optical element so as to detect a position of the stage in the first direction.

2. An exposure apparatus according to claim 1, wherein the first detector includes an interferometer system.

3. An exposure apparatus according to claim 2, wherein the second detector includes an interferometer system.

4. An exposure apparatus according to claim 1, wherein the exposure apparatus is a scanning type exposure apparatus.

5. An exposure apparatus according to claim 1, wherein the stage holds the substrate.

6. An exposure apparatus according to claim 1, wherein the stage has a plurality of the second optical elements.

7. An exposure apparatus according to claim 1, wherein the first optical element is apart from the second optical element.

8. An exposure apparatus according to claim 1, wherein the second optical element is located below the first optical element.

9. A method for exposing a pattern of a mask onto a substrate, the method comprising the steps of:

providing a stage that is capable of moving in a first direction;

providing a first optical element to the stage, the first optical element having an acute angle surface to the first direction;

providing a second optical element to the stage, the second optical element having a surface that is substantially perpendicular to the first direction;

disposing a projection optical system between the mask and the substrate to project the pattern onto the substrate;

holding the projection optical system and a third optical element in an integral manner, the third optical element being optically coupled to the first optical element;

measuring a position of the stage in a direction substantially perpendicular to the first direction using the first optical element and the third optical element; and measuring a position of the stage in the first direction using the second optical element.

10. A method according to claim 9, wherein the position of the stage is measured by an interferometer system.

11. A method according to claim 9, wherein the pattern is exposed when the stage moves in the first direction.

12. A method according to claim 9, wherein the stage holds the substrate.

13. A method according to claim 9, wherein the stage has a plurality of the second optical elements.

14. A method according to claim 9, wherein the first optical element is apart from the second optical element.

15. A method according to claim 9, wherein the second optical element is located below the first optical element.

16. An exposure apparatus that exposes a pattern onto a substrate, comprising:

a stage that holds the substrate and moves in a first direction;

a first optical element of the stage, the first optical element having a first acute angle surface to the first direction and a second acute angle surface to the first direction;

a second optical element of the stage, the second optical element having a surface that is substantially perpendicular to the first direction;

a projection optical system that faces to the substrate to project the pattern onto the substrate;

a support that holds the projection optical system;

a third optical element is held by the support, the third optical element having a reflection surface along the first direction and being optically coupled to the first optical element;

a detector optically coupled to the first, second and third optical elements to detect a position of the stage.

17. An exposure apparatus according to claim 16, wherein the detector comprises a first detector optically coupled to the first and third optical elements so as to detect a position of the stage in a direction substantially perpendicular to the first direction and a second detector optically coupled to the second optical element so as to detect a position of the stage in the first direction.

18. An exposure apparatus according to claim 17, wherein the first detector comprises an interferometer system.

19. An exposure apparatus according to claim 17, wherein the second detector comprises an interferometer system.

20. An exposure apparatus according to claim 16, wherein the exposure apparatus is a scanning type exposure apparatus.

21. An exposure apparatus according to claim 16, wherein the stage has a plurality of the second optical elements.

22. An exposure apparatus according to claim 16, wherein the first optical element is apart from the second optical element.

23. An exposure apparatus according to claim 16, wherein the second optical element is located below the first optical element.

* * * * *